United States Patent
Broutin et al.

(10) Patent No.: US 6,518,563 B1
(45) Date of Patent: Feb. 11, 2003

(54) DETECTING AGING OF OPTICAL COMPONENTS

(75) Inventors: Scott L. Broutin, Maxatawny Township, Berks County, PA (US); James Kevin Plourde, Allentown, PA (US); John William Stayt, Jr., Schnecksville, PA (US)

(73) Assignee: Agere Systems Inc., Allentown, PA (US)

( * ) Notice: Subject to any disclaimer, the term of this patent is extended or adjusted under 35 U.S.C. 154(b) by 66 days.

(21) Appl. No.: 09/599,108

(22) Filed: Jun. 22, 2000

(51) Int. Cl.[7] .............................. H01J 5/16; H01J 40/14; G01J 3/50
(52) U.S. Cl. .................................... 250/226; 250/214 R
(58) Field of Search ................................ 250/226, 205, 250/206, 214 R, 201.1

(56) References Cited

U.S. PATENT DOCUMENTS 4,785,454 A * 11/1988 Olsson et al. ................. 372/26
5,019,769 A * 5/1991 Levinson ...................... 372/31
5,742,418 A * 4/1998 Mizutani et al. ............. 359/156

* cited by examiner

Primary Examiner—Robert H. Kim
Assistant Examiner—Courtney Thomas
(74) Attorney, Agent, or Firm—Lester H. Birnbaum

(57) ABSTRACT

The invention in accordance with one aspect is a method of determining aging of a light emitting device which is capable of selectively emitting light having different wavelengths corresponding to different channels for light transmission as a function of tuning current supplied to the device. A tuning current is applied to the device which results in a wavelength corresponding to a desired channel. The slope of a curve which is light power from the device as a function of tuning current is determined by dithering about the applied tuning current. The determined slope is compared with a prior determined value in order to detect any change from the prior value. The voltage derived from a light signal passing through an optical filter can also be measured and compared to a prior value. These values may be used to determine aging of the device and the filter.

16 Claims, 3 Drawing Sheets

DETECTING AGING OF OPTICAL COMPONENTS

FIELD OF THE INVENTION

This invention relates to optical components and networks, and in particular to a method and circuit for detecting aging of such components.

BACKGROUND OF THE INVENTION

Optical networks are becoming increasingly important in telecommunications primarily due to their huge information handling capacity. One of the key elements of such a network is the light emitting device, which is usually in the form of a semiconductor laser, such as a Distributed Bragg Reflected (DBR) laser, which is capable of emitting light of several different wavelengths and therefore desirable in Dense Wavelength Division Multiplexing (DWDM) systems. For this type of application, the DBR laser is set to operate at these wavelengths by a selection of tuning currents at an initial temperature (typically 25 deg. C.). The selected wavelengths are typically stabilized by detecting a portion of the light emitted by the laser, usually from the backface of the laser, and transmitting the detected light through a filter whose output is a function of wavelength. The light is detected and then received by a wavelength control circuit which generates a signal in response thereto for either changing the bias supplied to the tuning section of the laser or the temperature of the laser. The wavelengths are then considered "locked" onto the desired value by the feedback circuitry. The desired wavelengths correspond to the transmission channels of the network also known as "ITU grid channels".

One of the problems with present networks is the fact that the laser and the optical filter will tend to age over a period of time. This aging can make it difficult to correlate the laser wavelengths with the proper channels. Compounding the problem is the fact that it may not be apparent whether the laser or the filter has aged, and therefore, proper correction is thwarted.

It is desirable, therefore, to provide a way of determining when the light emitting device and/or the optical filter has aged. It is further desirable to distinguish between the aging of the optical device and filter.

SUMMARY OF THE INVENTION

The invention in accordance with one aspect is a method of determining aging of a light emitting device which is capable of selectively emitting light having different wavelengths corresponding to different channels for light transmission as a function of electrical bias supplied to the device. A bias is applied to the device which results in a wavelength corresponding to a desired channel at an initial temperature. The slope of a curve which is light power from the device as a function of bias is determined at the applied tuning current. The determined slope is compared with a prior determined value in order to detect any change from the prior value.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
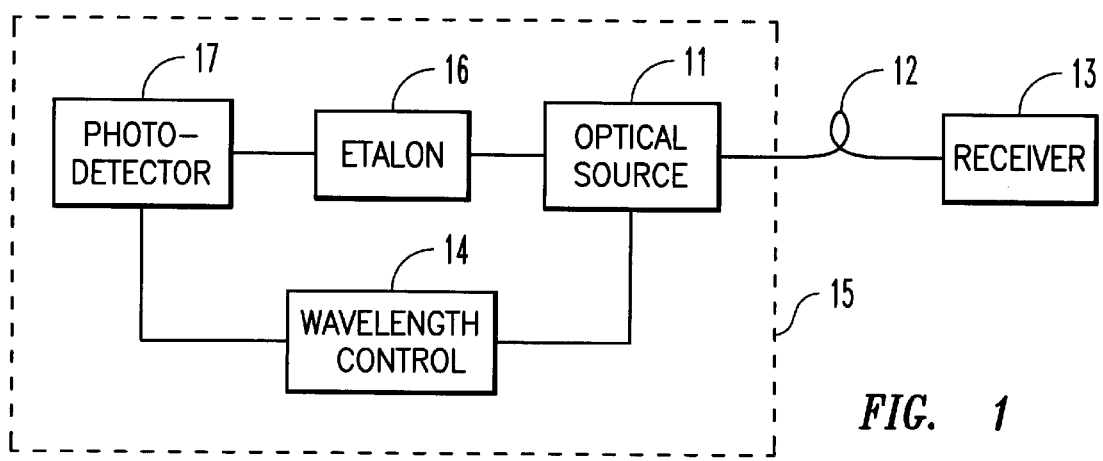
FIG. 1 is a schematic view of a portion of an optical network which can incorporate principles of the invention.

FIG. 1 illustrates a portion of a typical optical network, 10, which may include the invention. A transmitter, 15, includes an optical source, 11, which is typically a semiconductor laser such as a Distributed Bragg Reflector (DBR) laser. Light from the laser, in this example the front facet of the laser, is optically coupled to an optical fiber, 12, which is, in turn, coupled to a receiver, 13. Light from the laser, in this example the back facet, is preferably coupled to one or more optical filters such as Fabry Perot etalons, 16, whose outputs will be a function of the wavelength of the laser light. The output of the etalons are coupled to one or more photodetectors, 17, where the optical signal is converted to an electrical signal. The resulting electrical signal is coupled to a wavelength control circuit, 14, which provides an output controlling the wavelength of the laser, 11. In this example, the output of the wavelength control circuit adjusts the drive current supplied to the tuning section of the laser module to control the wavelength. Often the drive current goes to a thermoelectric cooler (TEC) to control laser wavelength via the laser operating temperature. While in this example light from the back face is monitored, it will be appreciated that front face light may also be used.

It will be appreciated that the network typically includes many other components, such as optical isolators, fiber amplifiers, and optical routers, which are not illustrated.

Figure 2:
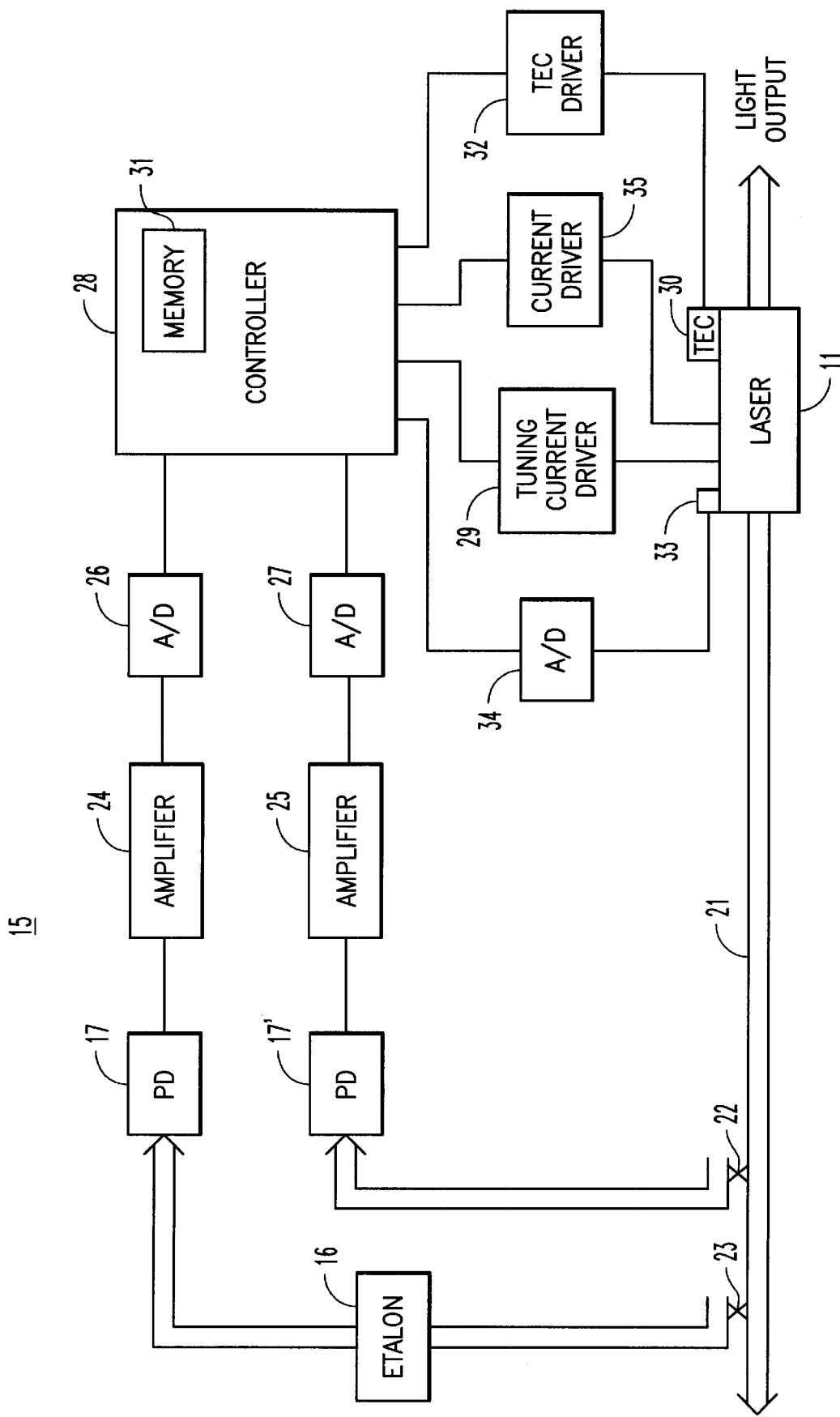
FIG. 2 is a more detailed schematic diagram of the transmitter of the network in accordance with an embodiment of the invention.

FIG. 2 illustrates the transmitter, 15, in further detail. Light from the back face of the laser, 11, is illustrated by the wide arrow, 21. A portion of the beam (preferably approx. 5–10 percent) is transmitted by coupler, 22, directly to a first photodetector, 17', while most if not all of the remainder of the beam is coupled by coupler 23 to the etalon, 16, and then to a second photodetector, 17. The electrical outputs of the photodetectors, 17 and 17' are amplified by amplifiers, 24 and 25, and the amplified signals are converted to digital signals by A/D converters, 26 and 27. It will be understood that the invention may also be used with conventional analog signal electronics if desired. The resulting signals are coupled to a micro-controller, 28, which can be a standard microprocessor. (The A/D converters can be internal to the microprocessor.) The microprocessor is programmed, among other things, to compare the inputs from the A/D converters, 26 and 27, and output a signal in response thereto which adjusts current supplied to the tuning section of the laser by a current driver, 29, to tune the laser to a desired wavelength. The microprocessor, 28, preferably can also adjust the wavelength of the laser by applying a signal through a driver, 32, to a thermoelectric cooler (TEC), 30, which is in contact with the laser, thereby adjusting the temperature of the laser making use of a feedback loop. A temperature sensor, 33, and an A/D converter, 34, may be part of the feedback loop to verify that the temperature of the laser is at an initial temperature, $T_o$, in the operation to be described. The microprocessor turns on the laser through a current driver, 35. The microprocessor, 28, includes memory, 31, which is configured to store, among other things, program operation and look-up tables as described below. Further, the transmitter, 15, can include more than one etalon, 16, and/or more than the number of feedback paths shown.

Figure 3:
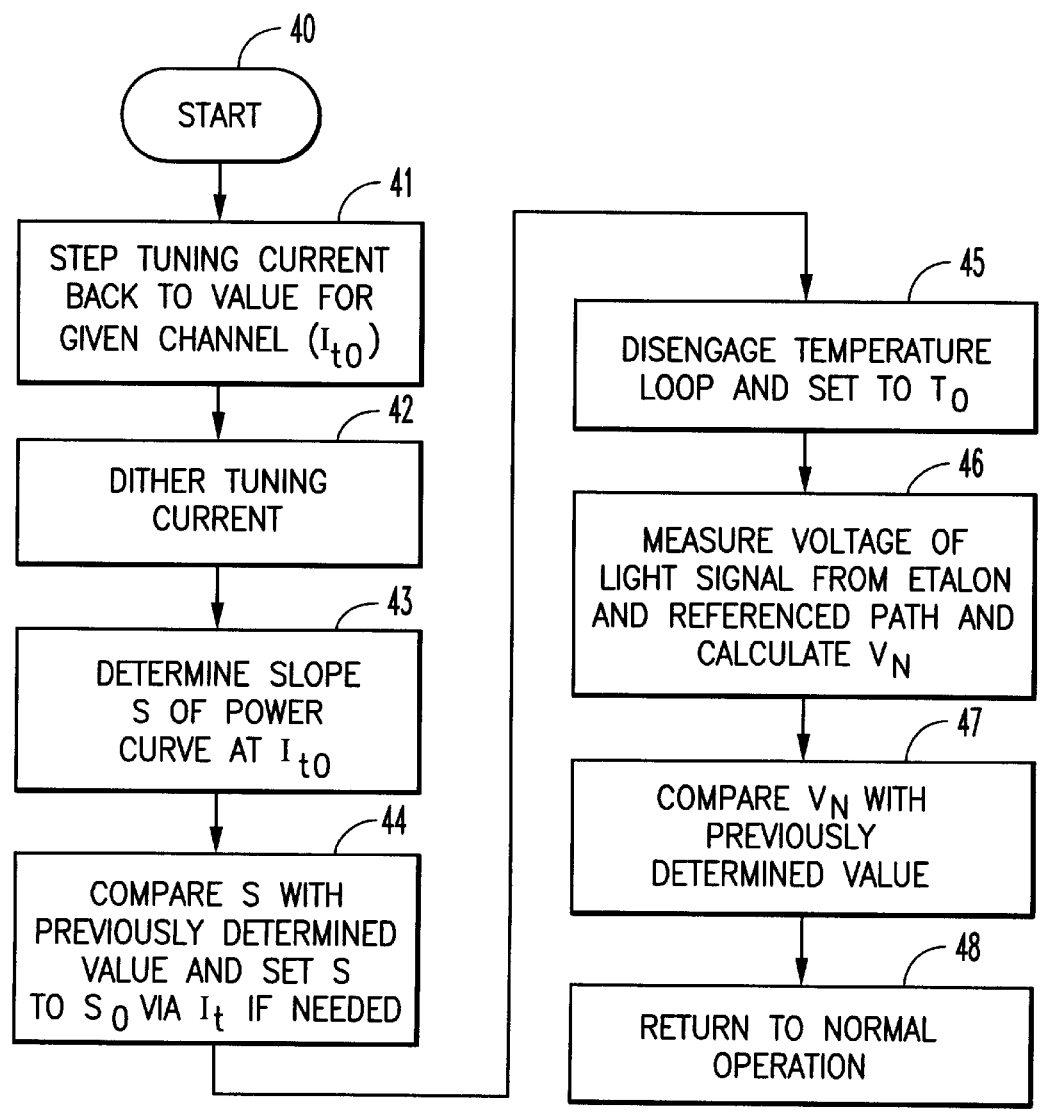
FIG. 3 is a flow diagram of a method of determining aging of components in accordance with an embodiment of the invention.

The operation of the transmitter for determining aging according to one embodiment will now be described with reference to the flow diagram of FIG. 3 and the curves illustrated in FIGS. 4–6. The operation can be controlled by firmware in the memory, 31.

Figure 4:
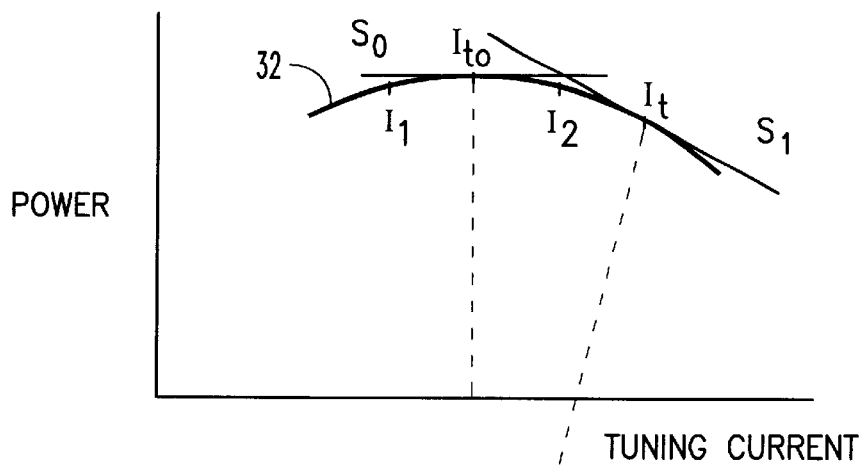
FIG. 4 is a sketch of light power as a function of tuning current for a laser which is part of the transmitter of FIG. 2.
Figure 5:
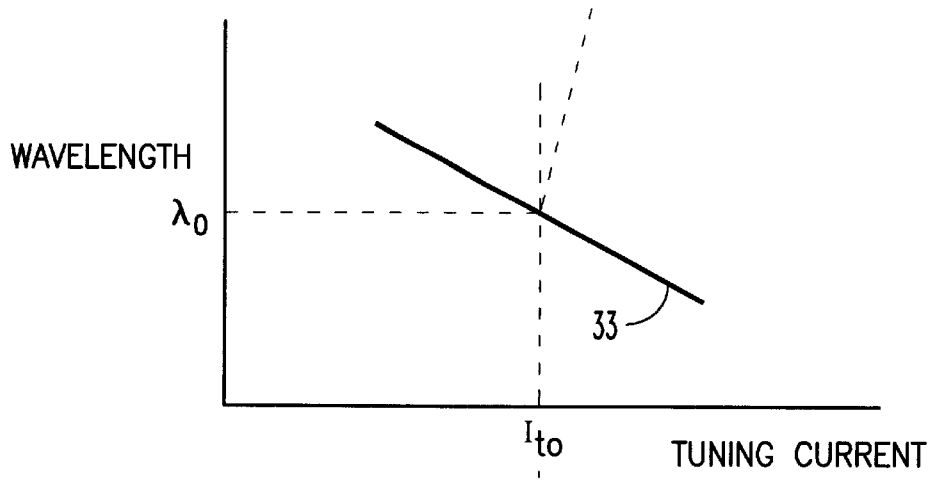
FIG. 5 is a sketch of the wavelength of the laser as a function of tuning current.
Figure 6:
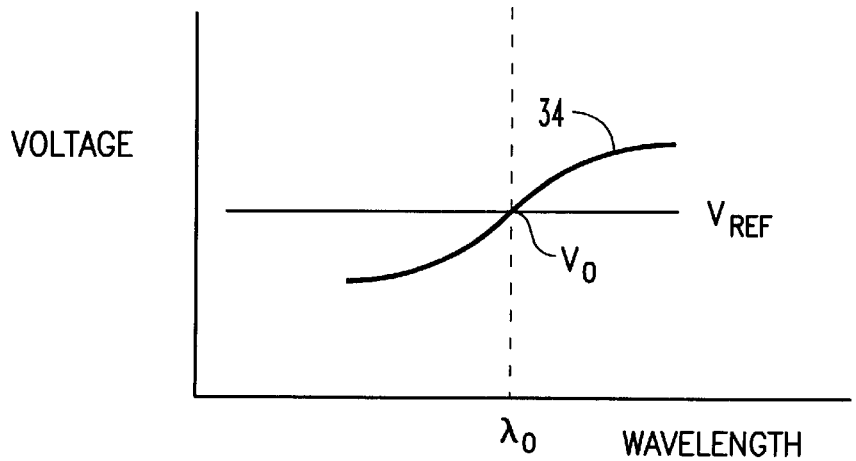
FIG. 6 is a sketch of the voltage of a signal derived from the laser light after passing through an optical filter (etalon) as a function of the wavelength of the laser light.

At some initial time, usually at the factory, an initial value of tuning current, $I_{to}$, is determined which will produce a grid channel wavelength, $\lambda_o$, at an initial temperature, $T_o$, as illustrated in FIGS. 4–6. The initial temperature, $T_o$, is usually 25 deg. C.

It will be noted that the grid channel, $\lambda_o$, is determined by the crossing point $V_o$ of the voltage, V, of the signal from the photodetector, 17, and a reference voltage, $V_{ref}$ from 17' (FIG. 2), as illustrated in FIG. 6. The optimal tuning current, $I_t$, has been previously selected so as to produce an optimal condition for the end-to-end system operations, an example of which includes maximum side mode suppression ratio (SMSR) for this channel based on the slope, $S_1$, of the power curve, 32, as shown in FIG. 4. (See U.S. patent application of Ackerman et al. 25-24-29-44, Ser. No. 09/475606 filed Dec. 30, 1999, which is incorporated by reference herein.) The wavelength control loop, comprising the microprocessor, 28, and the thermoelectric cooler, 30, (FIG. 2), keeps the output of the laser at the grid channel, $\lambda_o$, in spite of the shifting of the tuning current from the "normal value", $I_{to}$, which would produce the channel wavelength, $\lambda_o$, in the absence of the wavelength control loop. Thus, at the start, 40, the optimal tuning current $I_t$ is applied to the laser.

In order to determine if the laser and/or the etalon has aged, as illustrated in step 41, the tuning current is stepped back to the value, $I_{to}$, which would produce the grid channel, $\lambda_o$ and slope $S_o$ at $T_o$ if the device did not age. The value $S_o$ may be known, for example, from measurements made at the factory or in the field and stored in a look-up table in the memory, 31. The tuning current and temperature are controlled by the microprocessor, 28.

Next, as illustrated in step 42, the tuning current is preferably dithered about the value $I_{to}$, so that the slope, S, of the power curve at $I_{to}$ can be determined as illustrated by step 43. The slope, S, can be determined from the change in power at two different points on the power curve (e.g., $I_1$ and $I_2$), i.e., $S=\Delta P/\Delta I$. After the slope is determined, the tuning current is temporarily returned to the value, $I_{to}$.

Once the value S is determined, the controller, 28, sets S to its initial value $S_o$ if it has changed as illustrated in step 44. Next, the controller disengages the signal to the TEC, 30, as illustrated in step 45, and temporarily sets the temperature to $T_o$. Then, as illustrated in step 46, the voltage, V, of the signal from light passing through the etalon, 16, is measured by the controller, 28, and this voltage is normalized to calculate $V_n=V/V_{ref}$. This value of $V_n$ is compared with the initial value $V_{no}$ at the wavelength $\lambda_o$ in step 47. Since the wavelength is held at $\lambda_o$ the normalized signal $V_n$ from the light passing through the etalon, 16, would normally be the same as the initial value. (It will be noted in this example that $V/V_{ref}$ is equal to 1, but this need not be the case.)

The microprocessor, therefore, has two values, S, and $V_n$, which it compares with prior determined values ($S_o$ and $V_{no}$). These prior values would normally be factory specified parameters which are stored in the look-up table in memory 31 of the microprocessor. However, the prior values could also be determined in the field at a time prior to aging of the components or at a time when aging characteristics are known. Applicants' initial experimental data indicate that the slope S and the wavelength $\lambda$ of the laser will track as the laser ages. When the microprocessor determines that S has changed from its prior value, it means that the laser has aged since the prior value was established. The microprocessor can then apply the appropriate error signal to either the current driver, 29, or to the TEC, 30, to compensate for the change in laser operating characteristics. When the microprocessor determines that the slope, S, is unchanged, but that $V_n$ has changed from its prior value, it means that the etalon has aged since the prior value was established. The microprocessor can then apply the appropriate error signal to the TEC to compensate for the change in etalon characteristics due to aging. If both the laser and etalon age, the slope can be used as a reliable reference for wavelength. That is, once the value $S_o$ has been re-set, the voltage V can be measured to determine if the etalon has also changed.

Thus, it will be appreciated that the invention in this embodiment permits determining the aging of both the laser and etalon, and can distinguish between the two.

While the invention has been described by applying current signals to the TEC and tuning section of the laser it will be appreciated that other types of electrical bias, such as voltage signals and impedance changes, may be utilized in certain circumstances. It will also be appreciated that the power can be normalized prior to calculating the slope. Therefore, it will be understood in the attached claims that the terms "power" and "voltage" include normalized and unnormalized values of power and voltage, respectively.

What is claimed is:

1. A method of determining aging of a light emitting device which is capable of selectively emitting light having different wavelengths corresponding to different channels for light transmission as a function of a tuning electrical bias supplied to the device and determining aging of an optical filter through which the light is passed, the method comprising:

applying a first value of tuning electrical bias to the device which results in tuning the device to a wavelength corresponding to a desired channel while a control loop is engaged to control the temperature of the device;

determining the slope of a curve which is light power from the device as a function of tuning bias, said slope determined at the first value of tuning bias while the control loop is engaged;

comparing the determined slope with a prior determined value in order to detect any change from the prior value to determine aging of the device;

disengaging the temperature control loop and measuring a voltage signal derived from light from the device after passing through the optical filter; and comparing the measured voltage to a prior value in order to determine aging of the filter.

2. The method according to claim 1 wherein the light emitting device is a semiconductor laser.

3. The method according to claim 2 wherein the laser is a distributed bragg reflected laser.

4. The method according to claim 1 wherein the filter is a Fabry-Perot etalon.

5. The method according to claim 1 wherein the prior value is stored in a look-up table.

6. The method according to claim 1 wherein the steps are performed by a microprocessor.

7. The method according to claim 1 wherein the electrical bias is a tuning current.

8. The method according to claim 1 wherein a second value of tuning electrical bias is supplied to the device during normal operation, and then the bias is set back to said first tuning electrical bias to determine aging.

9. An optical transmitter comprising:

a light emitting device capable of selectively emitting light of different wavelengths corresponding to different channels for light transmission as a function of a tuning electrical bias applied to the device, an optical filter which receives at least a portion of the light from the device, and at least one photodetector which converts the light from the filter to an electrical signal; and wavelength control circuitry including a temperature control loop and a microcontroller configured to:

apply a first value of tuning electrical bias to the device which results in a wavelength corresponding to a desired channel while the control loop is engaged to control the temperature of the device;

determine the slope of a curve which is light power from the device as a function of tuning bias, said slope determined at the first value of tuning bias while the control loop is engaged;

compare the determined slope with a prior determined value in order to detect any change from the prior value to determine aging of the device;

measure the voltage from the detector when the control loop is disengaged; and compare the measured voltage to a prior determined value to determine aging of the filter.

10. The transmitter according to claim 9 wherein the light emitting device comprises a semiconductor laser.

11. The transmitter according to claim 10 wherein the laser is a distributed Bragg reflected laser.

12. The transmitter according to claim 9 wherein the microcontroller is a microprocessor.

13. The transmitter according to claim 9 wherein the microcontroller includes a memory element, and the prior value is stored in a look-up table in the memory.

14. The transmitter according to claim 9 wherein the microcontroller is configured to apply a tuning current to the device.

15. The transmitter according to claim 9 wherein the microcontroller is configured to apply a second value of tuning bias during normal operation to the device and then set back the bias to said first value of tuning bias for determining aging.

16. An optical network comprising a transmitter, an optical fiber coupled to the transmitter, and a receiver coupled to the optical fiber, the transmitter comprising a light emitting device capable of selectively emitting light of different wavelengths corresponding to different channels for light transmission as a function of a tuning electrical bias applied to the device, an optical filter which receives at least a portion of the light from the device, and at least one photodetector which converts the light from the filter to an electrical signal; and wavelength control circuitry including a temperature control loop and a microcontroller configured to:

apply a first value of tuning electrical bias to the device which results in a wavelength corresponding to a desired channel while the control loop is engaged to control the temperature of the device;

determine the slope of a curve which is light power from the device as a function of tuning bias, said slope determined at the first value of tuning bias while the control loop is engaged;

compare the determined slope with a prior determined value in order to detect any change from the prior value to determine aging of the device;

measure the voltage from the detector when the control loop is disengaged; and compare the measured voltage to a prior determined value to determine aging of the filter.

* * * * *